US006784698B1

(12) United States Patent
Brenden (10) Patent No.: US 6,784,698 B1
(45) Date of Patent: Aug. 31, 2004

(54) SENSE AMPLIFIER WITH IMPROVED COMMON MODE REJECTION

(75) Inventor: Jason P. Brenden, Woodbury, MN (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/459,058

(22) Filed: Jun. 11, 2003

(51) Int. Cl.[7] .............................................. G01R 19/00
(52) U.S. Cl. ............................. 327/51; 327/52; 327/54; 327/563
(58) Field of Search .............................. 327/51, 52, 54, 327/560–563, 536; 323/311–316, 364; 318/432–434, 825; 330/252–260

(56) References Cited

U.S. PATENT DOCUMENTS

| 4,766,400 | A | * | 8/1988 | Fox ............................. 332/107 |
| 5,124,673 | A | * | 6/1992 | Hershberger ................. 333/18 |
| 5,514,947 | A | * | 5/1996 | Berg ........................... 323/282 |
| 5,548,453 | A | * | 8/1996 | Sasaki et al. .................. 360/67 |
| 5,644,484 | A | * | 7/1997 | Elango ......................... 363/98 |
| 6,016,079 | A | * | 1/2000 | Reffay ........................ 330/255 |
| 6,084,378 | A | * | 7/2000 | Carobolante ................ 318/811 |
| 6,130,526 | A | * | 10/2000 | Yang et al. .................. 323/272 |
| 6,351,110 | B1 | * | 2/2002 | Pappalardo et al. ........ 323/285 |
| 6,417,639 | B1 | * | 7/2002 | Schillaci et al. ............ 318/560 |
| 6,538,507 | B2 | * | 3/2003 | Prentice et al. ............... 330/85 |
| 6,549,074 | B2 | * | 4/2003 | Ugajin et al. ............... 330/258 |
| 6,667,843 | B2 | * | 12/2003 | Norman et al. ............... 360/67 |

* cited by examiner

Primary Examiner—Timothy P. Callahan
Assistant Examiner—Hai L. Nguyen
(74) Attorney, Agent, or Firm—Kinney & Lange, P.A.

(57) ABSTRACT

A sense amplifier having improved common mode rejection has a differential input and a differential output. A first level shifting transconductance circuit is connected to receive the differential input. A gain and compensation circuit is connected to the level shifting transconductance circuit, and a buffer is connected to the gain and compensation circuit. The differential output of the sense amplifier is taken at an output of the buffer. A feedback network is connected between the output of the buffer and an input of the gain and compensation circuit. The feedback network includes a divider circuit connected to the output of the buffer and a second level shifting transconductance circuit connected between the divider circuit and the input of the gain and compensation circuit. The first and second level shifting transconductance circuits are preferably matched to one another for distortion cancellation.

18 Claims, 5 Drawing Sheets

SENSE AMPLIFIER WITH IMPROVED COMMON MODE REJECTION

BACKGROUND OF THE INVENTION

The present invention relates to a feedback system employing a sense amplifier, and more particularly to a sense amplifier circuit having improved common mode rejection.

There are many applications of electronic circuits that involve a sensor and a feedback configuration in which the sensed signal is employed to perform error compensation or a similar function. One particular application for a sensor and feedback circuit is a motor controller, such as for a disk drive actuator. This type of system employs a power amplifier for delivering a current to drive the actuator motor, a series sense resistor to sense the drive current, and a sense amplifier feeding back the sensed drive current to the power amplifier to perform error compensation. An exemplary configuration of such a system is shown in FIG. 1.

Figure 1:
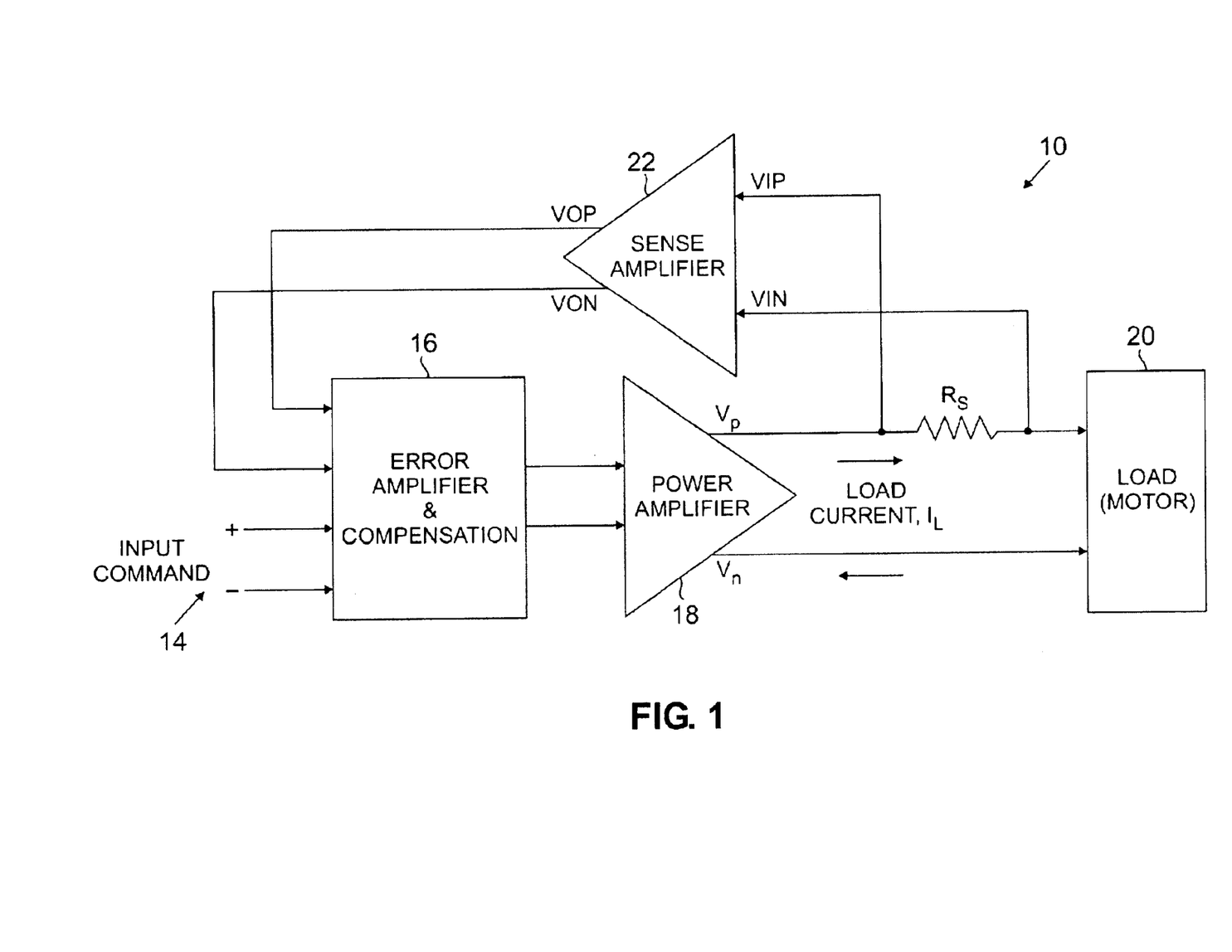
FIG. 1 is a schematic diagram of a motor controller employing a sense amplifier feedback circuit.

The feedback system of FIG. 1 has a number of parameters that must be controlled in order to achieve desired performance. The sense amplifier must be designed to provide a precise amount of gain to the sensed signal across the sense resistor. This gain must remain constant independent of the common mode signal, which may be orders of magnitude larger than the desired signal. In the system of FIG. 1, a higher bandwidth of sensing and error correction than that of the load (actuator motor) may be desired. The increased bandwidth is achieved by the error amplifier and compensation circuit connected to receive the feedback from the sense amplifier. This compensation may cause the common mode signal to be much larger than the desired signal across the sense resistor at frequencies above the load cutoff frequency. The sense amplifier must be able to reject this common mode signal, or inaccuracies and/or instability of the system may result.

Previous efforts to provide an effective sense amplifier feedback circuit have experienced a number of practical difficulties which limit their effectiveness. A classic solution has been to employ an operational amplifier with resistive feedback. However, the performance of this circuit depends on the ability to match the circuit's resistors precisely, and it is not possible to achieve such precise matching in a circuit implemented in silicon. As a result, the common mode rejection of this circuit is limited. Another solution that has been attempted is a single-ended transconductance amplifier circuit. This type of circuit is not able to linearly amplify signals, some of which may extend below ground by up to a diode voltage drop, and thus cannot achieve the precise gain required of a sense amplifier in a motor controller circuit such as is shown in FIG. 1.

There is a continuing need in the art for an improved motor controller circuit employing a sense amplifier feedback circuit with precise gain and outstanding common mode rejection. Such a circuit is the subject of the present invention.

BRIEF SUMMARY OF THE INVENTION

The present invention is a sense amplifier having improved common mode rejection. The sense amplifier has a differential input and a differential output. A first level shifting transconductance circuit is connected to receive the differential input. A gain and compensation circuit is connected to the level shifting transconductance circuit, and a buffer is connected to the gain and compensation circuit. The differential output of the sense amplifier is taken at an output of the buffer. A feedback network is connected between the output of the buffer and an input of the gain and compensation circuit. The feedback network includes a divider circuit connected to the output of the buffer and a second level shifting transconductance circuit connected between the divider circuit and the input of the gain and compensation circuit. The first and second level shifting transconductance circuits are preferably matched to one another for distortion cancellation.

DETAILED DESCRIPTION

FIG. 1 is a schematic diagram of motor controller 10 employing a sense amplifier feedback circuit. Motor controller 10 receives input command signal 14 into error amplifier and compensation circuit 16, which is in turn connected to power amplifier 18. Power amplifier 18 has a two-sided voltage signal (Vp and Vn) at its output terminals, and drives motor 20 (an inductive load) with load current $I_L$. Sense resistor Rs is connected in series between power amplifier 18 and motor 20 to sense load current $I_L$. Sense amplifier 22 is connected to opposite sides of sense resistor Rs, and has an output that is connected to error amplifier and compensation circuit 16 in a feedback configuration, to continually regulate the operation of motor controller 10 to provide an accurate load current $I_L$ to motor 20.

Motor controller 10 requires sense amplifier 22 to have a precisely controlled amount of gain, independent of the common mode signal, which may be orders of magnitude larger in size than the signal being sensed across sense resistor Rs. As discussed above, prior attempts to provide a sense amplifier have not been fully successful in realizing these characteristics, indicating that further improvement in the design of sense amplifier 22 is needed.

Figure 2:
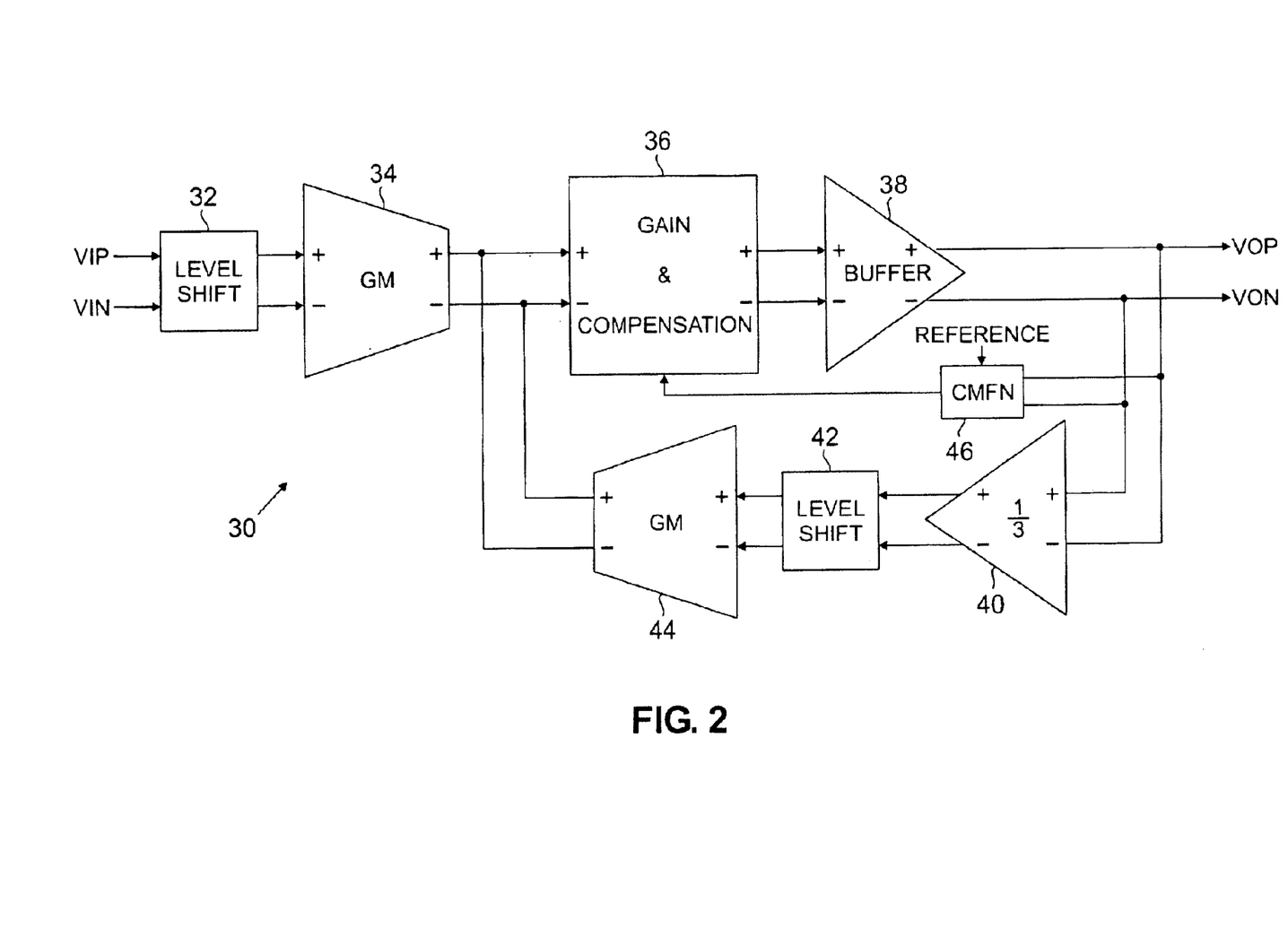
FIG. 2 is a schematic diagram of a sense amplifier according to the present invention.

FIG. 2 is a schematic diagram of sense amplifier 30 according to the present invention. Sense amplifier 30 receives a two-sided input signal (VIP and VIN) into level shifting circuit 32, which linearly shifts the signal up by a fixed amount. The shifted signal is input to transconductance stage 34, which amplifies the shifted signal and drives gain and compensation stage 36. Transconductance stage 34 and gain and compensation stage 36 are both employed in order to improve the gain accuracy of the circuit, and gain and compensation stage 36 also includes frequency compensation circuitry to maintain stability. Gain and compensation stage 36 drives unity gain buffer 38, which removes loading problems at the output of sense amplifier 30. Buffer 38 in turn drives divide-by-three stage 40, which drives level shifting circuit 42 and transconductance stage 44. Level shifting circuit 42 and transconductance stage 44 are matched to level shifting circuit 32 and transconductance stage 34, respectively, and are connected to close the feedback loop. The output of the circuit is taken at the output of unity gain buffer 38, and is a two-sided output signal (VOP and VON) with a total gain of about 3. Common mode feedback network circuit 46 is connected between the output of the circuit and gain and compensation stage 36 to provide information that allows gain and compensation stage 36 to effectively perform its frequency compensation functions.

Sense amplifier 30 has a number of features that result in improved performance over the current state of the art. Level shifting circuit 32 is operable to shift the voltage level of the input signal by a constant amount (about 1.2 volts in an exemplary embodiment), independent of the value of the input signal itself. Since the input signal can actually swing below ground by as much as a diode drop, the level shifting ensures that the signal delivered to transconductance stage 34 has a positive value. This improves the linearity of the sense amplifier's response. Furthermore, employing level shifting circuit 42 and transconductance stage 44 in the feedback path that matches level shifting circuit 32 and transconductance stage 34 serves to cancel any distortion introduced to the input signal by level shifting circuit 32 and transconductance stage 34, making the circuit fully differential and significantly improving the circuit's accuracy.

Figure 3:
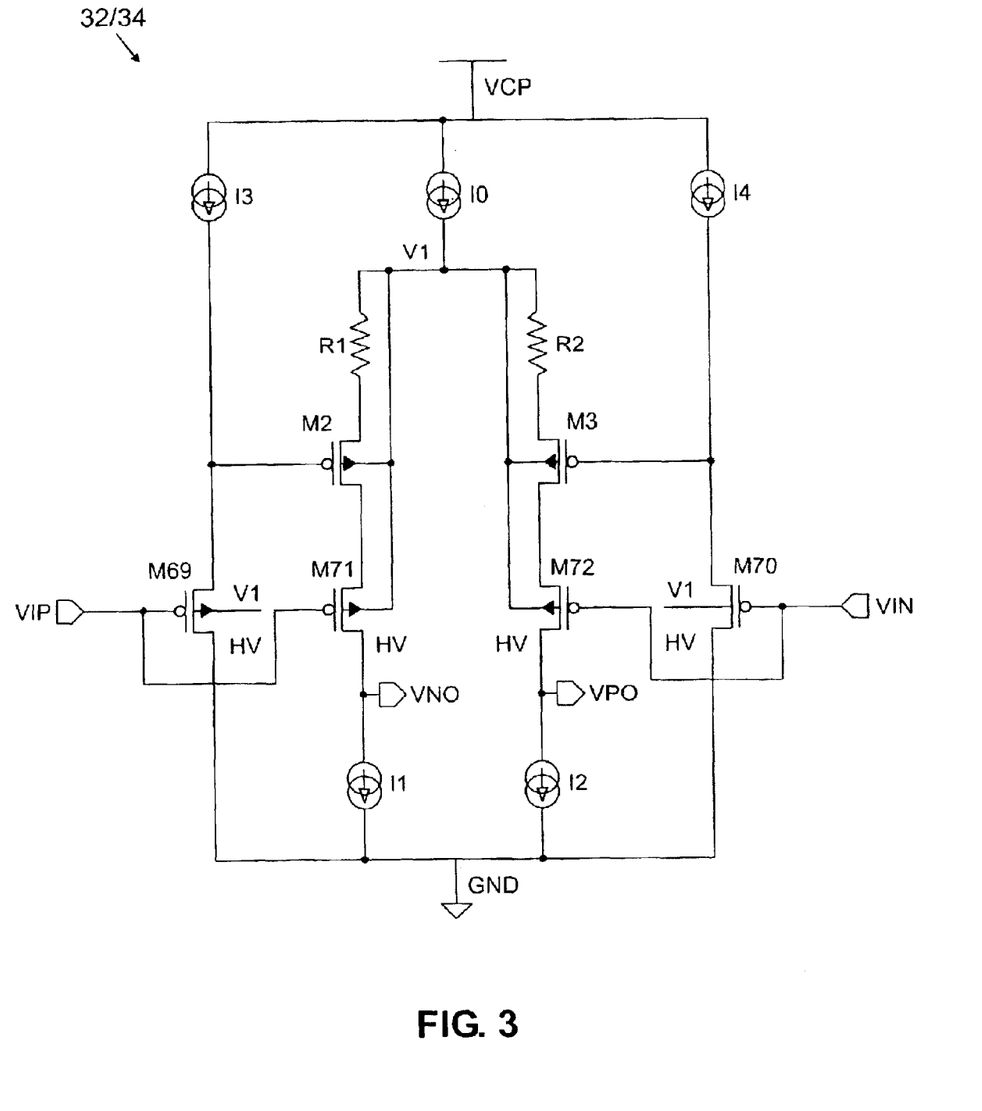
FIG. 3 is a schematic diagram of the components employed in the level shifting and transconductance circuits of the sense amplifier of FIG. 2.

FIG. 3 is a schematic diagram of the components employed in level shifting circuit 32 and transconductance stage 34 of sense amplifier 30 of FIG. 2. Although level shifting circuit 32 and transconductange stage 34 are shown as separate functional blocks in FIG. 2, it will be understood by those skilled in the art that the circuit shown in FIG. 3 performs both of these functions. As such, the circuit shown in FIG. 3 will be referred to hereafter as level shifting transconductance circuit 32/34.

Level shifting transconductance circuit 32/34 includes transistors M69 and M71 connected to input signal VIP, and transistors M70 and M72 connected to input signal VIN. Transistors M69 and M70, in combination with current sources 13 and 14 connected respectively to the sources of transistors M69 and M70, form level shifters to shift the input voltage up by a threshold voltage as an input to the differential pair of transistors M2 and M3. Transistors M69 and M70, as well as transistors M71 and M72, are high voltage (e.g., 20-volt) metal oxide semiconductor (MOS) devices in an exemplary embodiment, and supply voltage VCP is well over the circuit supply voltage, such as about 16–20 volts, generated through a charge pump circuit. The bulk connections of transistors M69, M70, M71 and M72 are connected to common potential V1, which increases the shifting threshold voltage by an amount that enables the level shifting operation to be effective even slightly below ground.

Transistors M2 and M3 are connected as a differential pair, with transistor M2 having its drain connected to the source of transistor M71 and its gate connected to the source of transistor M69, and with transistor M3 having its drain connected to the source of transistor M72 and its gate connected to the source of transistor M70. Again, the bulk connections of transistors M2 and M3 are connected to common potential V1. Degeneration resistors R1 and R2 are connected to the sources of transistors M2 and M3, respectively, to improve linearity. Differential input voltages up to about 400 milli-volts will be converted to current through differential pair M48–M67 with improved linearity, and the remaining non-linearities are canceled because of the fully differential nature of the circuit. Current source 10 provides the bias for differential pair M2–M3. Cascoded transistors M71 and M72 act as level shifters which track the input voltage and level shift the voltage such that the drain voltages of transistors M2 and M3 track with the gate voltages of transistors M71 and M72. Thus, the deployment of transistors M71 and M72 allows all of the terminals of differential pair M2–M3 to float with the common mode input voltage, which significantly improves the common mode rejection of the circuit. It also allows transistors M2 and M3 to be low voltage devices, which are smaller and much more easily matched than high voltage devices.

The output of the level shifting transconductance circuit (VNO and VPO) is taken at the drains of transistors M71 and M72. Current sources 11 and 12 act as the load for the transconductance cell, and are shared by the input transconductance cell (34, FIG. 2) and the feedback transconductance cell (44, FIG. 2).

Figure 4:
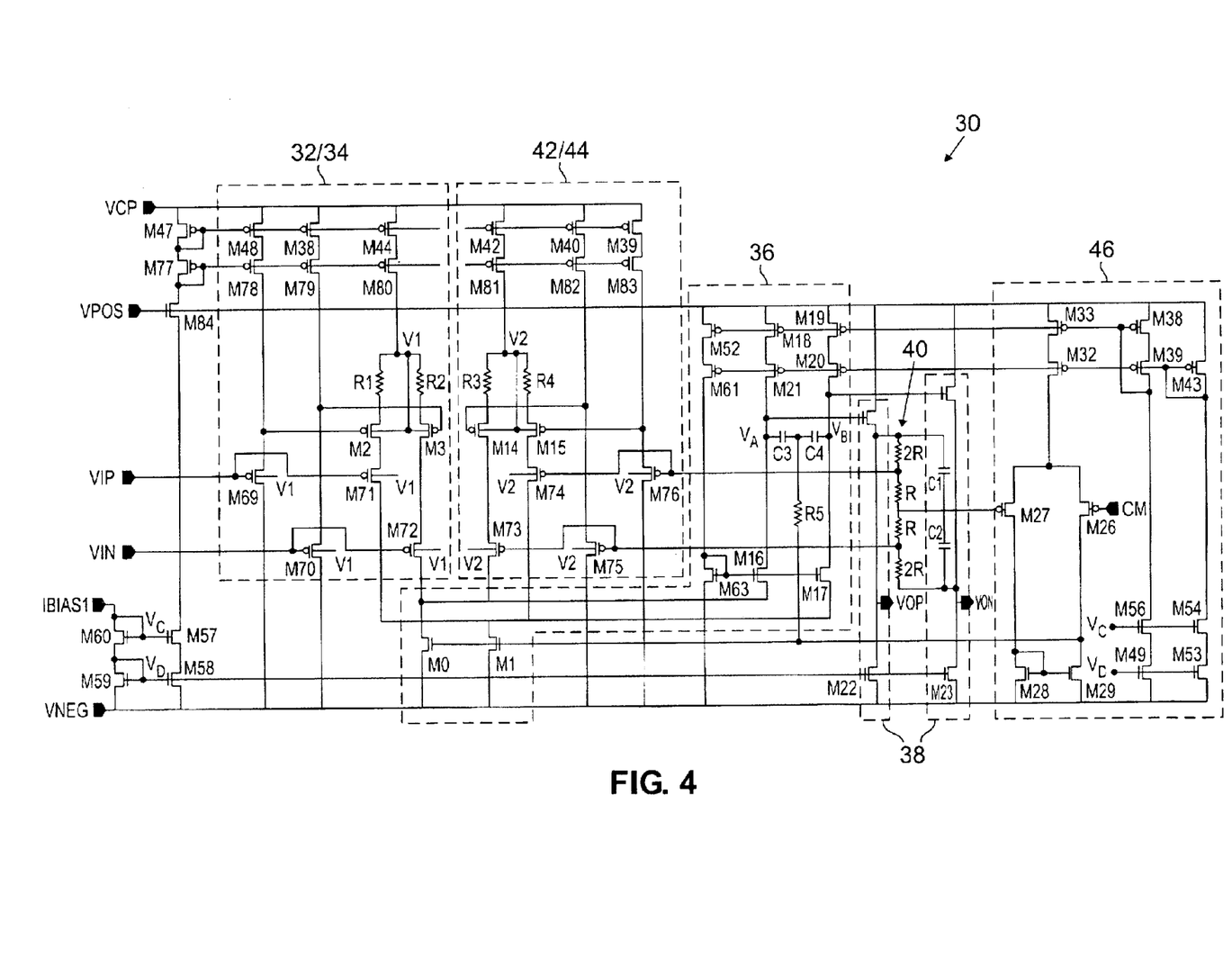
FIG. 4 is a schematic diagram of all of the components employed in the sense amplifier of FIG. 2.

FIG. 4 is a schematic diagram of all of the components employed in sense amplifier 30 of FIG. 2. Level shifting transconductance circuit 32/34 has components that are matched with those of level shifting transconductance circuit 42/44 connected in the feedback path of the circuit, to cancel any distortion introduced by level shifting transconductance circuit 32/34. The components making up gain and compensation circuit 36, buffer 38 and divide-by-three circuit 42 are also shown.

Sense amplifier 30 uses power supplies VCP, which is a high voltage power supply (e.g., 16–20 volts) generated by a charge pump circuit in an exemplary embodiment, VPOS, which is a low voltage positive supply (e.g., 3.3 volts), and VNEG, which is typically connected to ground (0 volts). The input signal (VIP and VIN) drives level shifting transconductance circuit 32/34, which includes transistors M69, M70, M71, M72, M2 and M3, and resistors R9 and R10, and has a cascoded current source formed by transistors M48, M78, M38, M79, M44 and M80. Currents are sourced from the VCP supply to allow enough head room so that the common mode signal may go above about 12 volts. Feedback level shifting transconductance circuit 42/44 includes transistors M76, M75, M74, M73, M15 and M14, and resistors R3 and R4, and has a cascoded current source formed by transistors M42, M81, M40, M82, M39 and M83. Currents are again sourced from the VCP supply to match the input level shifting transconductance circuit 32/34. Cascode transistors M77, M78, M79, M80, M81, M82 and M83 are high voltage devices, to protect the low voltage current source devices of the circuit. Transistor M84 is a high voltage NMOS device acting as a cascode to protect the low voltage current mirror formed by transistors M57, M58, M59 and M60.

The outputs of level shifting transconductance circuits 32/34 and 42/44 are connected to current sources formed by transistors M0 and M1, and the current is then folded through cascode transistors M16 and M17. From this point on, all circuitry is powered by low voltage power supply VPOS to reduce power dissipation and allow the use of only low voltage devices, which take up less silicon area and are easier to match to one another. Transistor M63 provides the necessary bias to the cascode devices. Additional gain is provided by cascode transistors M16 and M17, which provide current to cascoded current sources formed by transistors M18, M19, M20 and M21 to create a very high impedance differential output at VA and VB. The differential loop is compensated at these high impedance points by capacitors C1 and C2. Transistors M24 and M25 act as source follower buffers to drive the output at VOP and VON. Current source transistors M22 and M23 provide the necessary bias current for the source follower transistors. The differential output is divided by three using a resistive divider made up of four resistors (shown as R and 2R). The resistive divider drives feedback level shifting transconductance circuit 42/44 to complete the feedback loop. As a result, a fully differential, buffered amplifier with a gain of three is achieved.

Common mode feedback network 46 is included to set the common mode voltage at the output of sense amplifier 30, since sense amplifier 30 has a fully differential structure. This is accomplished by differential pair transistors M27 and M26 and a current mirror load formed by transistors M28 and M29. Bias current is provided by transistors M33 and M32. Differential pair transistors M27 and M26 compare the sensed common mode signal taken at the middle of the resistor divider to a common mode reference voltage CM (e.g., 1 volt). The differential pair, in conjunction with transistors M28 and M29, amplifies the sensed error signal and applies it to the gates of transistors M0 and M1 to adjust the load current until the actual common mode signal is equal to the desired common mode signal as commanded by the reference voltage VCM. The common mode feedback loop is compensated using Miller compensation by resistor R5 and capacitors C3 and C4. Capacitors C1 and C2 provide high frequency feedback to the common mode loop.

Figure 5:
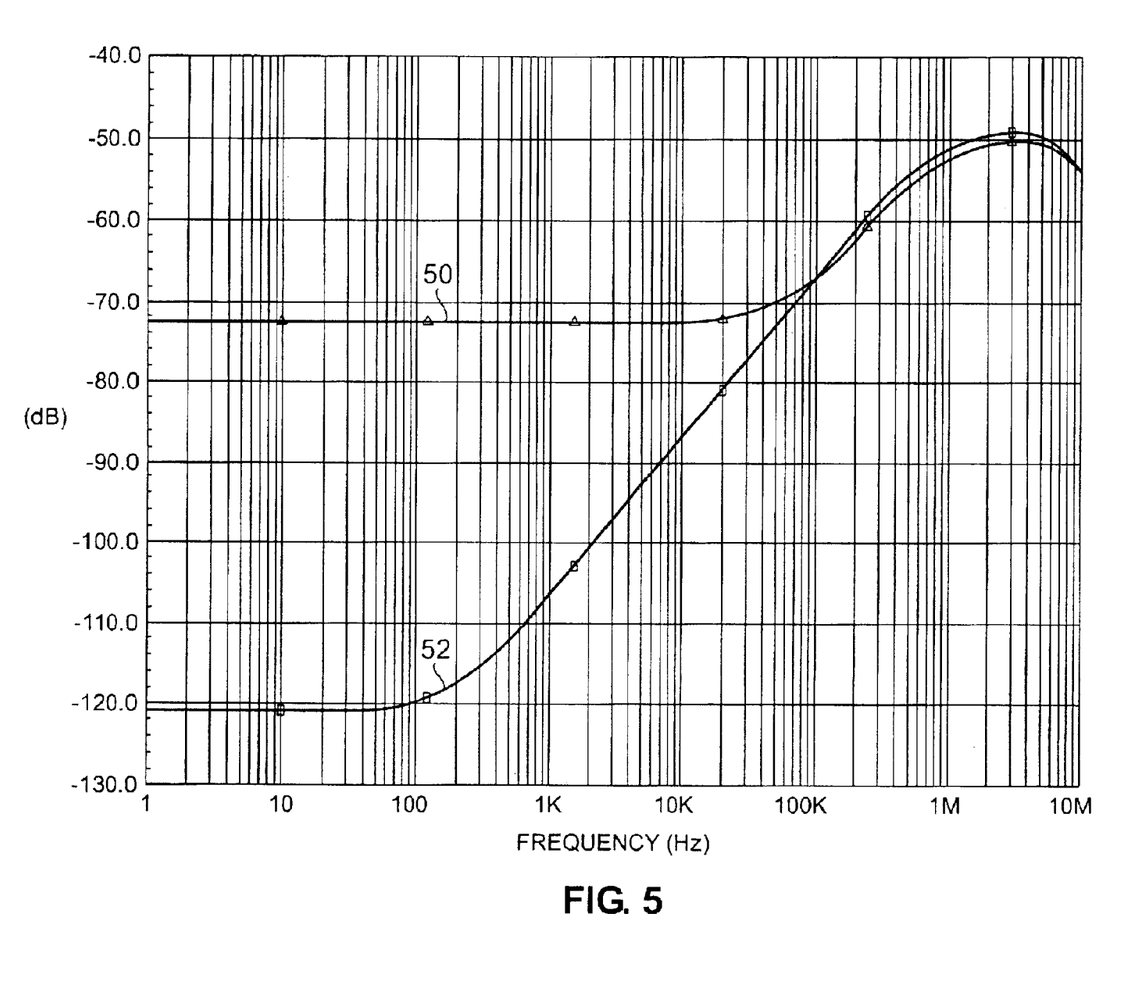
FIG. 5 is a graph illustrating the effect of the level shifting circuits employed in the sense amplifier of the present invention.

FIG. 5 is a graph illustrating the common mode rejection effect of the sense amplifier (employing level shifting transconductance circuits) of the present invention compared to a prior art sense amplifier, taken with a differential input signal of 30 milli-volts. Curve 50 shows the common mode rejection ratio (CMRR) for a prior art sense amplifier, while curve 52 shows the common mode rejection ratio for sense amplifier 30 of the present invention, as a function of frequency. Curve 50 illustrates that the CMRR of the prior art sense amplifier is about −72 dB for frequencies up to about 10 kilo-Hertz (kHz), and increases for frequencies above about 100 kHz. Curve 52 illustrates that the CMRR of sense amplifier 52 is about −120 dB for frequencies up to about 100 Hz, gradually changes to about −87 dB at about 10 kHz, and has similar performance as the prior art sense amplifier at frequencies above about 100 kHz. Since CMRR, as shown in FIG. 5, is defined as the ratio of the common mode gain to the differential gain, sense amplifier 30 provides superior common mode rejection performance over the prior art sense amplifier. Also, it will be understood by those skilled in the art that the frequency response of sense amplifier 30 shown by curve 52 can be varied by adjusting certain parameters and values of the components of the circuit, and the frequency response shown in FIG. 5 is exemplary for a particular selection of components parameters and values.

The present invention provides a fully differential sense amplifier that has a number of characteristics which are useful for utilization in a feedback circuit such as a motor controller for a disc drive. The common mode rejection of the sense amplifier is significantly improved over prior art amplifiers. Even when a differential input signal is applied, the addition of cascoded level shifters in the sense amplifier allows the differential pair of the amplifier to float with the common mode signal, improving the common mode rejection performance of the amplifier. The fully differential structure of the sense amplifier of the present invention also allows for a larger signal swing at the output. The level shifting circuitry employed by the sense amplifier of the present invention allows the input to extend below the lower power supply (e.g., ground), which is useful for sensing inductive currents in an application such as an inductive motor controller. The sense amplifier is constructed with an input level shifting transconductance circuit and a feedback level shifting transconductance circuit that is identically matched to the input level shifting transconductance circuit. As a result, distortion is canceled and a highly linear amplifier is obtained. In an exemplary embodiment, the gain of the sense amplifier is handled by employing a linear resistor divider network in the feedback path, and a buffered output is achieved through the use of source follower transistors to eliminate loading effects.

The sense amplifier circuit of the present invention can be implemented on an integrated circuit using a small amount of silicon area, in part due to the use of a number of low voltage components. The sense amplifier circuit also provides a very precise linear gain that is independent of the common mode voltage signal, which improves the linearity of the sense amplifier's response when used as part of a feedback system.

Although the present invention has been described with reference to preferred embodiments, workers skilled in the art will recognize that changes may be made in form and detail without departing from the spirit and scope of the invention. Particularly, while some forms of the invention are described in the form of discrete devices, it is recognized that the circuit is preferably reduced to practice in the form of an integrated circuit (IC). Therefore, terms such as "device" and the like should be construed in their broadest contexts to include portions of ICs that are conveniently described as functional components, as well as discrete devices. Likewise, some forms of the invention are described in terms of logical gates and chips that could also be implemented by discrete devices, all within the scope and spirit of the present invention. Similarly, the present invention has been described in terms of exemplary embodiments employing MOS transistor devices having a control region (gate) and multiple controlled regions (source and drain). It will be understood by those skilled in the art that the principles of the present invention are applicable to circuits that employ other active devices having control and controlled regions or terminals.

What is claimed is:

1. A sense amplifier having a differential input and a differential output, the sense amplifier comprising:
   a first level shifting transconductance circuit connected to receive the differential input;
   a gain and compensation circuit connected to the level shifting transconductance circuit;
   a buffer connected to the gain and compensation circuit, wherein the differential output of the sense amplifier is taken at an output of the buffer; and
   a first feedback network connected between the output of the buffer and an input of the gain and compensation circuit, comprising:
     a divider circuit connected to the output of the buffer; and
     a second level shifting transconductance circuit connected between the divider circuit and the input of the gain and compensation circuit.

2. The sense amplifier of claim 1, wherein the first and second level shifting transconductance circuits are identically matched to one another.

3. The sense amplifier of claim 1, further comprising a second feedback network connected between the output of the buffer and the gain and compensation circuit to set a common mode output of the sense amplifier.

4. The sense amplifier of claim 1, wherein the first and second level shifting transconductance circuits each comprise:
   a first pair of transistors comprising:

a first transistor connected to a first node of the differential input; and
a second transistor connected to a second node of the differential input;
a second pair of transistors comprising:
a third transistor connected to the first node of the differential input; and
a fourth transistor connected to the second node of the differential input;
a third pair of transistors comprising:
a fifth transistor having a control region connected to the first transistor and having a first controlled region connected to the third transistor in a cascode configuration; and
a sixth transistor having a control region connected to the second transistor and having a first controlled region connected to the fourth transistor in a cascode configuration;
a first degeneration resistor connected to a second controlled region of the fifth transistor; and
a second degeneration resistor connected to a second controlled region of the sixth transistor.

5. The sense amplifier of claim 4, wherein bulk connections of the first, second, third, fourth, fifth and sixth transistors are connected to a common voltage.

6. The sense amplifier of claim 4, wherein the first, second, third and fourth transistors are high voltage MOS devices, and the fifth and sixth transistors are low voltage MOS devices.

7. The sense amplifier of claim 1, wherein the divider circuit is a divide-by-three circuit.

8. The sense amplifier of claim 1, wherein the divider circuit is a resistive circuit.

9. The sense amplifier of claim 1, having all components realized in an integrated circuit (IC).

10. A feedback control system for driving a load in response to a differential input command signal, comprising:
an error amplifier and compensation circuit receiving the differential input command signal;
a power amplifier connected to an output of the error amplifier and compensation circuit;
a sense resistor connected between an output of the power amplifier and the load; and
a sense amplifier having an input connected across the sense resistor to detect a current flowing through the sense resistor, and having an output connected to an input of the error amplifier and compensation circuit, the sense amplifier comprising:
a first level shifting transconductance circuit connected to receive the differential input;
a gain and compensation circuit connected to the level shifting transconductance circuit;
a buffer connected to the gain and compensation circuit, wherein the differential output of the sense amplifier is taken at an output of the buffer; and
a first feedback network connected between the output of the buffer and an input of the gain and compensation circuit, comprising:
a divider circuit connected to the output of the buffer; and
a second level shifting transconductance circuit connected between the divider circuit and the input of the gain and compensation circuit.

11. The feedback control system of claim 10, wherein the first and second level shifting transconductance circuits of the sense amplifier are identically matched to one another.

12. The sense amplifier of claim 10, wherein the sense amplifier further comprises a second feedback network connected between the output of the buffer and the gain and compensation circuit to set a common mode output of the sense amplifier.

13. The sense amplifier of claim 10, wherein the first and second level shifting transconductance circuits of the sense amplifier each comprise:
a first pair of transistors comprising:
a first transistor connected to a first node of the differential input; and
a second transistor connected to a second node of the differential input;
a second pair of transistors comprising:
a third transistor connected to the first node of the differential input; and
a fourth transistor connected to the second node of the differential input;
a third pair of transistors comprising:
a fifth transistor having a control region connected to the first transistor and having a first controlled region connected to the third transistor in a cascode configuration; and
a sixth transistor having a control region connected to the second transistor and having a first controlled region connected to the fourth transistor in a cascode configuration;
a first degeneration resistor connected to a second controlled region of the fifth transistor; and
a second degeneration resistor connected to a second controlled region of the sixth transistor.

14. The feedback control circuit of claim 13, wherein bulk connections of the first, second, third, fourth, fifth and sixth transistors of the first and second level shifting transconductance circuits of the sense amplifier are connected to a common voltage.

15. The feedback control circuit of claim 13, wherein the first, second, third and fourth transistors of the first and second level shifting transconductance circuits of the sense amplifier are high voltage MOS devices, and the fifth and sixth transistors of the first and second level shifting transconductance circuits of the sense amplifier are low voltage MOS devices.

16. The feedback control circuit of claim 10, wherein the divider circuit of the sense amplifier is a divide-by-three circuit.

17. The feedback control circuit of claim 10, wherein the divider circuit of the sense amplifier is a resistive circuit.

18. The feedback control circuit of claim 10, having all components realized in an integrated circuit (IC).

* * * * *

UNITED STATES PATENT AND TRADEMARK OFFICE
CERTIFICATE OF CORRECTION

PATENT NO.    : 6,784,698 B1
DATED         : August 31, 2004
INVENTOR(S)   : Jason P. Brenden

It is certified that error appears in the above-identified patent and that said Letters Patent is hereby corrected as shown below:

Column 3,
Line 37, delete "13", insert -- I3 --
Line 51, delete "arc", insert -- are --
Line 64, delete "10", insert -- I0 --

Column 4,
Line 11, delete "11", insert -- I1 --

Signed and Sealed this

Third Day of May, 2005

JON W. DUDAS
*Director of the United States Patent and Trademark Office*